(12) United States Patent
Lee et al.

(10) Patent No.: US 6,221,761 B1
(45) Date of Patent: Apr. 24, 2001

(54) METHOD OF STABILIZING ANTI-REFLECTION COATING LAYER

(75) Inventors: Kan-Yuan Lee, Tainan Hsien; Weiching Horng, Tai-Chung; Joe Ko; Gary Hong, both of Hsinchu, all of (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/467,284

(22) Filed: Dec. 20, 1999

(51) Int. Cl.[7] .................................................. H01L 21/4763
(52) U.S. Cl. .......................... 438/636; 438/769; 438/786
(58) Field of Search .................................... 438/636, 669, 438/952, 717, 724, 744, 769, 786

(56) References Cited

U.S. PATENT DOCUMENTS 5,525,542 * 6/1996 Maniar et al. ...................... 438/669

* cited by examiner

Primary Examiner—Charles Bowers
Assistant Examiner—Hsien-Ming Lee
(74) Attorney, Agent, or Firm—Jiawei Huang; J.C. Patents

(57) ABSTRACT

A method of stabilizing an anti-reflection coating (ARC) layer is disclosed. The method provides a substrate with a dielectric layer, a conductive layer, and the ARC layer formed thereon. The ARC layer is treated in an ultraviolet (UV) curing step prior to forming a photoresist layer over the ARC layer, so that the specificity of the ARC layer is stabilized to allow an accurate pattern is replicated in the photoresist layer. A photomask with the desired pattern is provided, while a photolithographic process is then performed to transfer the pattern onto the wafer.

19 Claims, 2 Drawing Sheets

METHOD OF STABILIZING ANTI-REFLECTION COATING LAYER

BACKGROUND OF THE INVENTION

1. Field of Invention

The present invention relates to a method of fabricating an anti-reflection coating (ARC) layer. More particularly, the present invention relates to a method of stabilizing the ARC layer.

2. Description of Related Art

During a photolithography module of an integrated circuit (IC) fabrication, masks are often made to allow several patterns to be transferred onto a wafer. Each of the masks is usually formed by irradiating a layer of photoresist with light, while unwanted areas of photoresist are removed in a development step to leave behind the desired mask. However, those masks have known to be formed over many reflective materials such as aluminum or polycrystalline silicon which often reflect light into regions of photoresist that are not intended to be irradiated. The unintentional irradiation causes the resulting mask to be inaccurate by causing reflective notching in the mask or inaccurate line width.

Reflective notching on highly reflective substrates and linewidth (or critical dimension, CD) variations due to topography and film thickness non-uniformity have been a difficult problem for semiconductor manufacturers. A useful method such as an anti-reflective coating (ARC) has been developed to suppress reflectivity, which method involves applying an ARC layer over the reflective material before the application of the photoresist. Conventionally, different types of ARC layers, including organic and inorganic ones have been developed. Since problems, such as reacting with the underlying layers have occurred when the organic ARC layers are used, most of the process preferentially adopts the inorganic ARC layer instead.

Typically, an inorganic ARC layer, such as silicon oxy-nitride (SiON) layer is used to prevent the above-mentioned problem. FIGS. 1A and 1B are cross-sectional, schematic diagrams illustrating the fabrication of ARC layer during a conventional photolithography module, in which a substrate 100 is provided with a gate oxide layer 102, a polysilicon layer 104, and a SiON layer 106 formed in sequence thereon. A photoresist layer 108 is then formed over the SiON layer 106. Next, an exposure step is performed where a selected light source that passes through a photomask 110 irradiates the photoresist layer 108 to initiate a photochemical transformation, which replicates a desired mask pattern in the photoresist layer 108a. A development step is then performed to transfer the mask pattern onto the wafer.

It has recently been known that reflectance of the SiON layer 106 fluctuates over time, while the reflectance fluctuation of the SiON layer 106 makes it difficult to control the exposure conditions during the photolithographic process. This leads to reflective notching in the photomask 110, where the desired pattern is distorted. Subsequently, a part of the photoresist layer 108b is removed, leading to formation of IC device with non-uniform CD. A quality control step, such as after develop inspection (ADI) is executed to check whether the specification of the photolithography process is met, while the photolithography module is stripped and reworked to compensate any abnormalities that causes permanent damage to the wafer in the subsequent process. However, measurements of CD taken during ADI indicate that the reflectance of the SiON layer 106 still fluctuates under the same exposure conditions even after reworks. Therefore, it is necessary to develop a method for stabilizing the specificity of the SiON layer.

SUMMARY OF THE INVENTION

The invention provides a method of stabilizing an anti-reflection coating (ARC) layer, which method provides a substrate with a dielectric layer, a conductive layer, and the ARC layer. The ARC layer is treated in an ultraviolet (UV) curing step prior to forming a photoresist layer over the ARC layer. A photomask with a desired pattern is provided over the photoresist layer and a photolithographic process is performed, so that the pattern is transferred onto the wafer.

As embodied and broadly described herein, the invention provides an UV curing step which irradiates the ARC layer with UV light followed by heating the ARC layer in a furnace. The UV curing step is performed in this case to stabilize the specificity of the ARC layer, which has been known to suppress the undesired reflection off the substrate.

Accordingly, the UV curing step is performed to stabilize the specificity of the ARC layer, so that the reflectance of the ARC layer is maintained as a stable value even the photolithographic module is reworked to ensure that critical dimensions (CD) are within the specified tolerances. Therefore, the exposure conditions are stabilized in the photolithographic process, while it is possible to control the critical dimension (CD) of the IC device. The problems related to CD inaccuracy are thus solved according to the method developed in the present invention, so that the fabrication is verified as correctly carried out. Furthermore, since the UV curing step is compatible to a resist processing step in the photolithographic module, such treatment to stabilize the ARC layer does not add extra steps to complicate the process.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
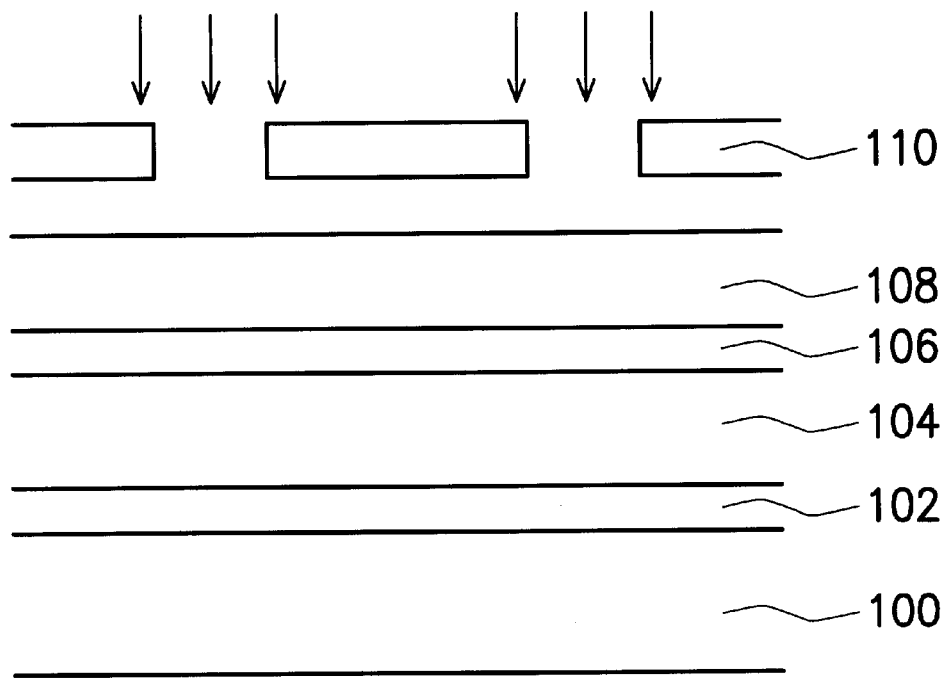
FIGS. 1A and 1B are cross-sectional, schematic diagrams illustrating the fabrication of ARC layer during a conventional photolithography module.
Figure 1B:
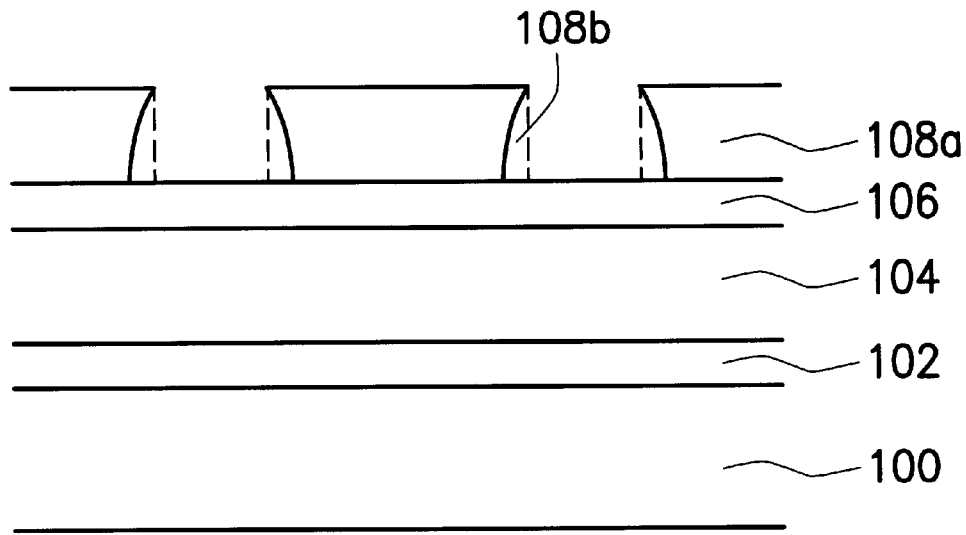
Figure 2A:
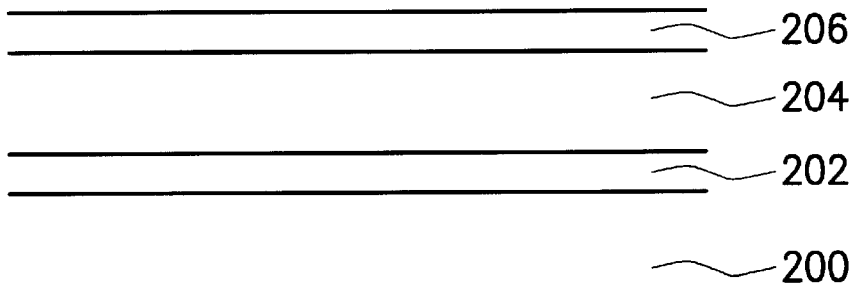
FIGS. 2A through 2C are cross-sectional, schematic diagrams illustrating the fabrication of ARC layer during a conventional photolithography module according to one preferred embodiment of this invention.
Figure 2B:
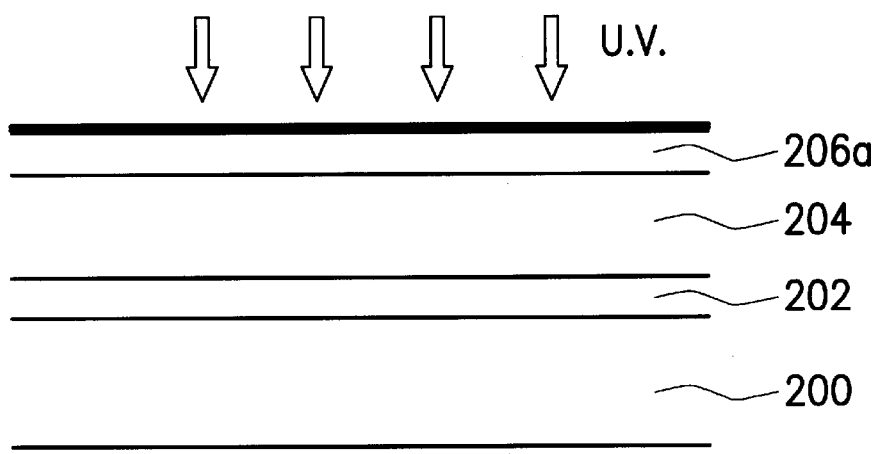
Figure 2C:
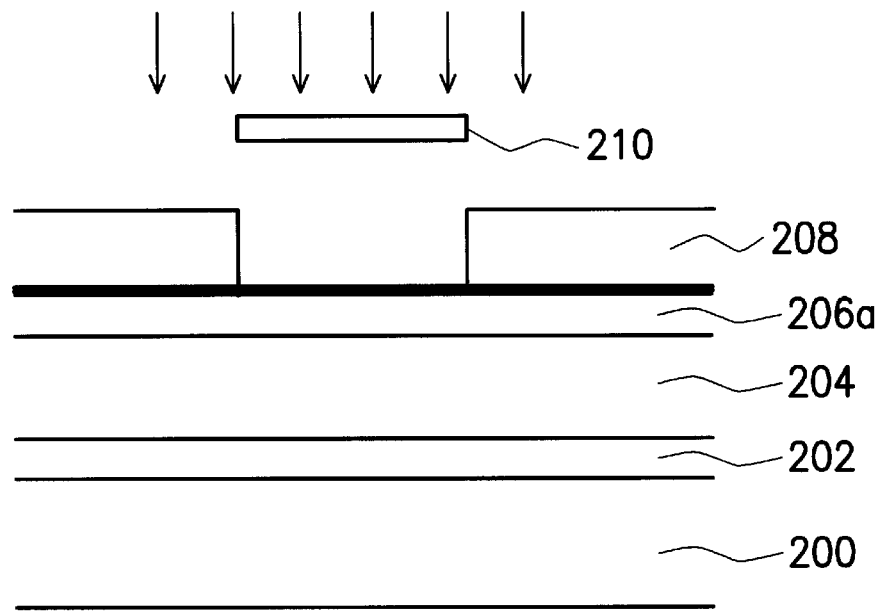

Description is made with FIGS. 2A through 2C to show fabrication process of an anti-reflection coating layer incorporated with a treatment suggested in the present invention to stabilize an anti-reflection coating (ARC) layer. It is noted that only the process steps pertinent to the ARC layer fabrication is emphasized, while the rest of the process steps will not be described in detailed herein as they have been known in the conventional art.

Referring to FIG. 2A, a substrate 200 is provided with a dielectric layer 202, a conductive layer 204 formed in sequence thereon. Preferably, the dielectric layer 202 includes a gate oxide layer and is formed to have a thickness of about 15–80 angstroms. The conductive layer 204 may include material, such as polysilicon and is formed to have a thickness of about 1000–4000 angstroms. Next, an ARC layer 206, preferably silicon oxy-nitride (SiON) layer is formed over the conductive layer 204. The SiON layer 206 has a thickness of about 100–400 angstroms.

Referring to Fig, 2B, the SiON layer 206 is treated in an UV curing step to stabilize its feature, such as reflectance after formation of the SiON layer 206. The UV curing step involves irradiating the SiON layer 206 with an UV light and heating the SiON layer in a furnace. The preferable wavelength is selected from a range of about 350–450 nm, while the exposure time of UV irradiation is about 30–300 seconds. The irradiation is known to increase the molecular weight of the resin at the surface, most likely through cross-linking. Therefore, the mechanism of UV curing involves the formation of a surface skin. After the treatment, the SiON layer 206 is changed into a treated SiON layer 206a that is shown in FIG. 2B to have a thicker top surface.

Referring to FIG. 2C, a photoresist layer 208 is formed over the treated SiON layer 206a, followed by providing a photomask 210 with a desired pattern (not shown) on top of the treated SiON layer 206a. A photolithographic process is performed, which includes an exposure step and development step, wherein the exposure step initiates a photochemical reaction to replicates a pattern in the photoresist 208, and the development step allows the pattern to be transferred onto the wafer. Measurements of critical dimension (CD) of the IC device is made in an after development inspection (ADI) step to indicate that the reflectance of the SiON layer 206a. The result shows the reflectance of the SiON layer 206a remains constant under the same exposure conditions even the whole photolithographic module is reworked again to compensate any abnormalities that causes permanent damage to the wafer in the subsequent process. Since the UV curing step described above has reduced the fluctuation of the reflectance of the SiON layer to a minimal, the exposure conditions are in turn stabilized in the photolithographic process. Thus, the CD of the IC device is kept uniform, while the possible problems related to CD inaccuracy in the subsequent process are solved.

Summarizing form the above, the UV curing step is performed to stabilize the specificity of the SiON layer, so that the reflectance of the SiON layer is maintained as a stable value even the photolithographic module is reworked to correct the defects made according to previous process rule. Therefore, the exposure conditions are stabilized in the photolithographic process, while it is possible to control the CD of the IC device in the present invention. In addition, the UV curing step is compatible to the UV hardening of photoresist in the photoresist processing step, so this new treatment to the SiON layer does not add extra steps which otherwise complicate the process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of stabilizing an anti-reflection coating (ARC) layer, which is applicable to a CMOS fabrication, the method comprising steps of:

providing a substrate with a dielectric layer, a conductive layer, and an ARC layer formed in sequence thereon;

performing an ultraviolet (UV) curing step upon the ARC layer, so that the ARC layer is stabilized;

after performing the UV curing step, forming a photoresist layer over the ARC layer;

providing a photomask above the photoresist layer; and performing a photolithographic process, so that the pattern in the photomask is transferred on to a surface of wafer.

2. The method of claim 1, wherein the dielectric layer includes a gate oxide layer.

3. The method of claim 1, wherein the conductive layer comprises a polysilicon layer.

4. The method of claim 1, wherein the ARC layer includes a silicon oxy-nitride layer.

5. The method of claim 1, wherein the UV curing step includes:

irradiating the ARC layer with an UV light; and heating the ARC layer in the furnace.

6. The method of claim 5, wherein the UV light has a wavelength range of about 350–450 nm.

7. The method of claim 5, wherein an exposure time of UV irradiation is about 30–300 seconds.

8. The method of claim 5, the step of heating the ARC layer in the furnace is performed at about 350–550° C.

9. A method of stabilizing an ARC layer, the method comprising steps of:

providing a substrate with a gate oxide layer, a polysilicon layer, and an ARC layer formed in sequence thereon;

performing a UV curing step upon the ARC layer to stabilize the ARC layer;

after performing the UV curing step, forming a photoresist layer over the ARC layer;

providing a photomask above the photoresist layer; and performing a photolithographic process, so that the pattern in the photomask is transferred on to a surface of wafer.

10. The method of claim 9, wherein the UV curing step comprises irradiating the ARC layer together with a UV light.

11. The method of claim 9, wherein the UV curing step is performed at a temperature of about 350–550° C.

12. The method of claim 11, wherein the UV light has a wavelength range of about 350–450 nm.

13. The method of claim 9, wherein an exposure time of UV irradiation is about 30–300 seconds.

14. The method of claim 9, wherein the ARC layer includes silicon oxynitride.

15. A method of stabilizing an ARC layer, the method comprising steps of:

providing a substrate with a gate oxide layer, a polysilicon layer, and an ARC, layer formed in sequence thereon;

performing a UV curing step upon the ARC layer to stabilize the ARC layer, wherein the UV curing step comprises irradiating the ARC layer with a UV light and heating then heating the ARC layer in the furnace;

after performing the UV curing step, forming a photoresist layer over the ARC layer;

providing a photomask above the photoresist layer; and performing a photolithographic process, so that the pattern in the photomask is transferred on to a surface of wafer.

16. The method of claim 15, wherein the UV curing step comprises irradiating the ARC layer together with a UV light.

17. The method of claim 15, wherein the UV light has a wavelength range of about 350–450 nm.

18. The method of claim 15, wherein an exposure time of UV irradiation is about 30–300 seconds.

19. The method of claim 15, wherein the step of heating the ARC layer in the furnace is performed at about 350–550° C.

* * * * *